(12) United States Patent
Fan et al.

(10) Patent No.: US 8,282,345 B2
(45) Date of Patent: Oct. 9, 2012

(54) HEAT DISSIPATING DEVICE

(75) Inventors: Chen-Lu Fan, Taipei Hsien (TW);
Li-Ping Chen, Taipei Hsien (TW);
Yi-Lung Chou, Taipei Hsien (TW);
Hung-Chieh Chang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 756 days.

(21) Appl. No.: 12/482,890

(22) Filed: Jun. 11, 2009

(65) Prior Publication Data

US 2010/0172740 A1 Jul. 8, 2010

(51) Int. Cl.
*F04D 29/66* (2006.01)
(52) U.S. Cl. .................. 415/119; 415/213.1; 415/214.1
(58) Field of Classification Search .................. 415/119, 415/213.1, 214.1; 361/695
See application file for complete search history.

(56) References Cited

U.S. PATENT DOCUMENTS

| | | | | | |
|---|---|---|---|---|---|
| 4,807,718 | A | * | 2/1989 | Lotz | 181/202 |
| 5,060,901 | A | * | 10/1991 | Lathrop et al. | 248/343 |
| 7,289,321 | B2 | * | 10/2007 | Patel et al. | 361/695 |
| 7,545,641 | B2 | * | 6/2009 | Chen | 361/695 |
| 7,558,061 | B2 | * | 7/2009 | Franz et al. | 361/695 |
| 7,907,404 | B2 | * | 3/2011 | Wu et al. | 361/695 |
| 2010/0027231 | A1 | * | 2/2010 | Chang et al. | 361/807 |

* cited by examiner

*Primary Examiner* — Ninh H Nguyen
(74) *Attorney, Agent, or Firm* — Altis Law Group, Inc.

(57) ABSTRACT

A heat dissipating device includes a receiving bracket adapted to be mounted in an electronic device enclosure and a fan module accommodated in the receiving bracket. The fan module includes a fan and a mounting bracket connected to the fan. The fan is secured to the mounting bracket via a plurality of fasteners. Each fastener has a securing head. A plurality of vibration absorbers is disposed between the fan and the fastener. Each vibration absorber includes two isolating walls. One of the isolating walls is sandwiched by the fan and the mounting bracket, and the other isolating wall is sandwiched by the mounting bracket and the fastener securing head, so as to isolate the mounting bracket, the fan, and the fastener.

18 Claims, 6 Drawing Sheets

HEAT DISSIPATING DEVICE

BACKGROUND

1. Technical Field

The present disclosure relates to heat dissipation, and particularly, to a heat dissipating device used in a computer system.

2. Description of Related Art

Heat dissipating devices perform the critical function of removing heat from a computer system. The heat dissipating device often includes one or more fans received in a bracket. For example, in a server system, a plurality of fans is provided to efficiently dissipate heat. The fans are secured to a bracket, and the bracket is mounted in a server enclosure. When the server system is running, vibration generated by the disk drive or other devices secured in the server system is transferred to the server enclosure and the bracket. The fans can be adversely affected by the vibration, such that heat dissipation efficiency is impaired.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
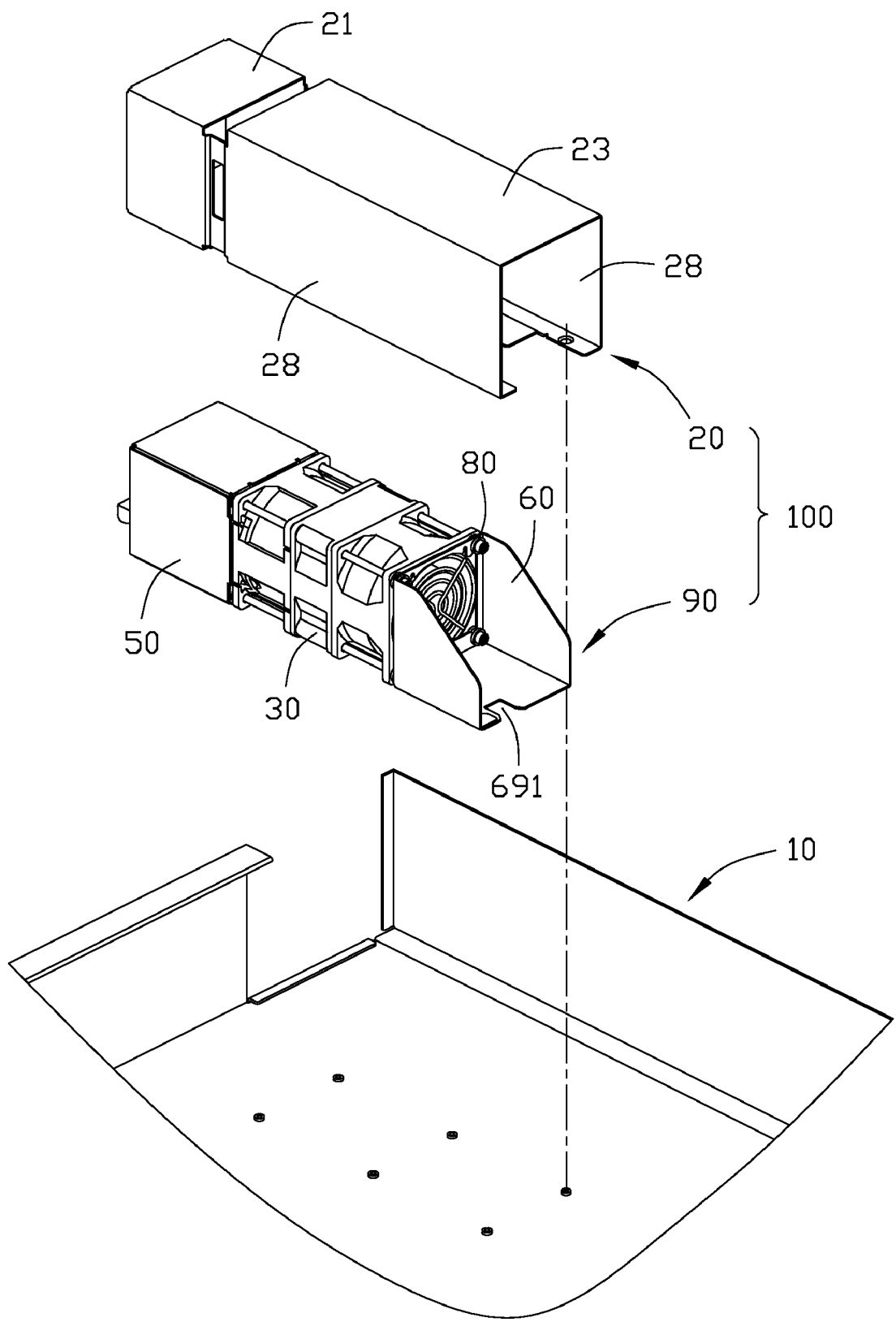
FIG. 1 is an exploded, isometric view of an embodiment of a heat dissipating device deployed in an electronic device enclosure.

Referring to FIG. 1, an embodiment of a heat dissipating device 100 includes a receiving bracket 20 configured to be mounted in an electronic device enclosure 10, and a fan module 90 configured to be accommodated in the receiving bracket 20.

Figure 2:
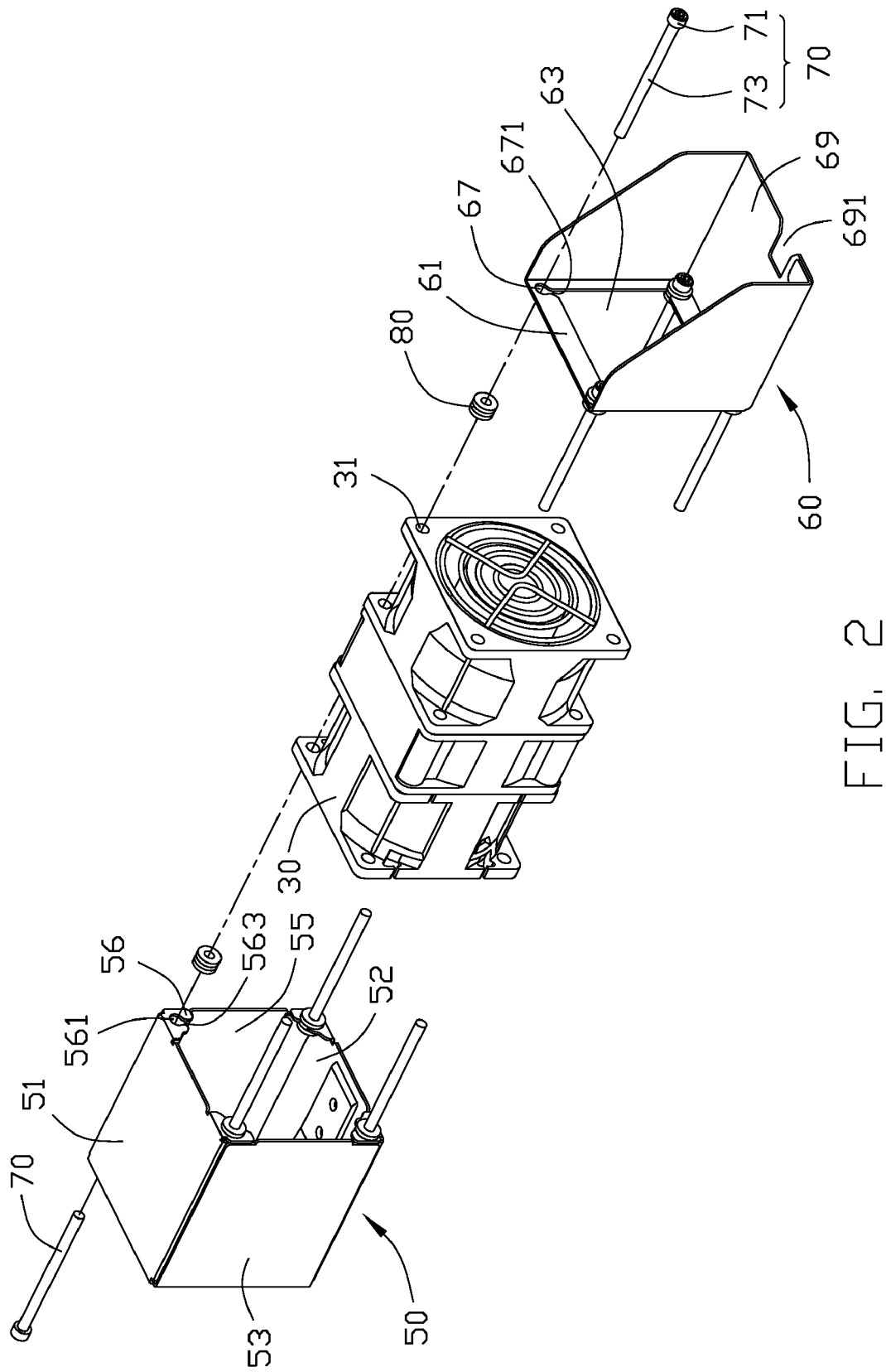
FIG. 2 is an exploded, isometric view of the fan module in FIG. 1.
Figure 3:
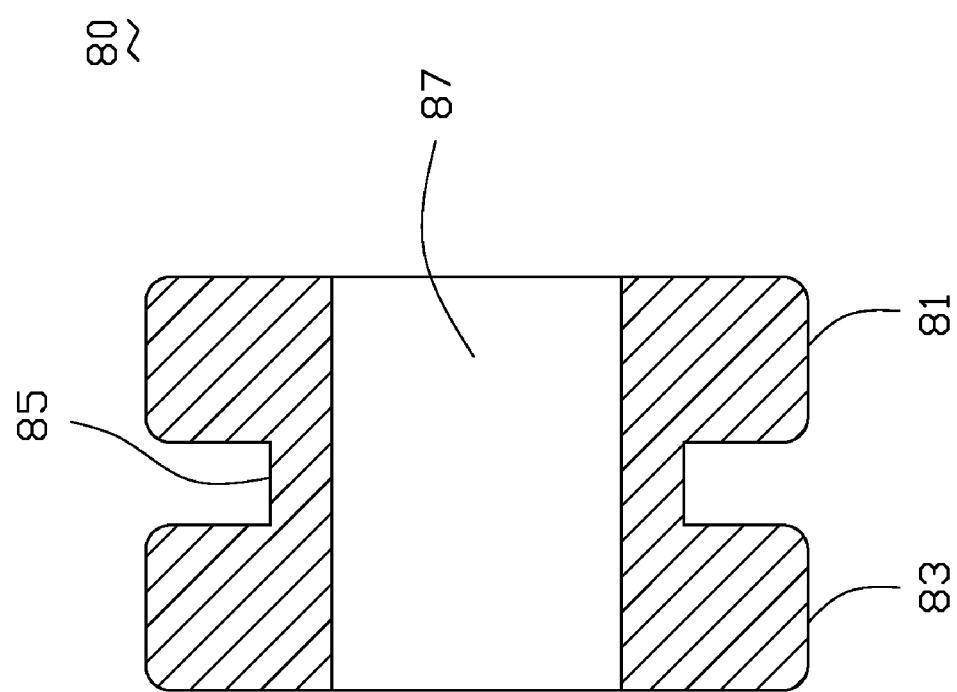
FIG. 3 is an enlarged view of the vibration absorbers in FIG. 2.
Figure 4:
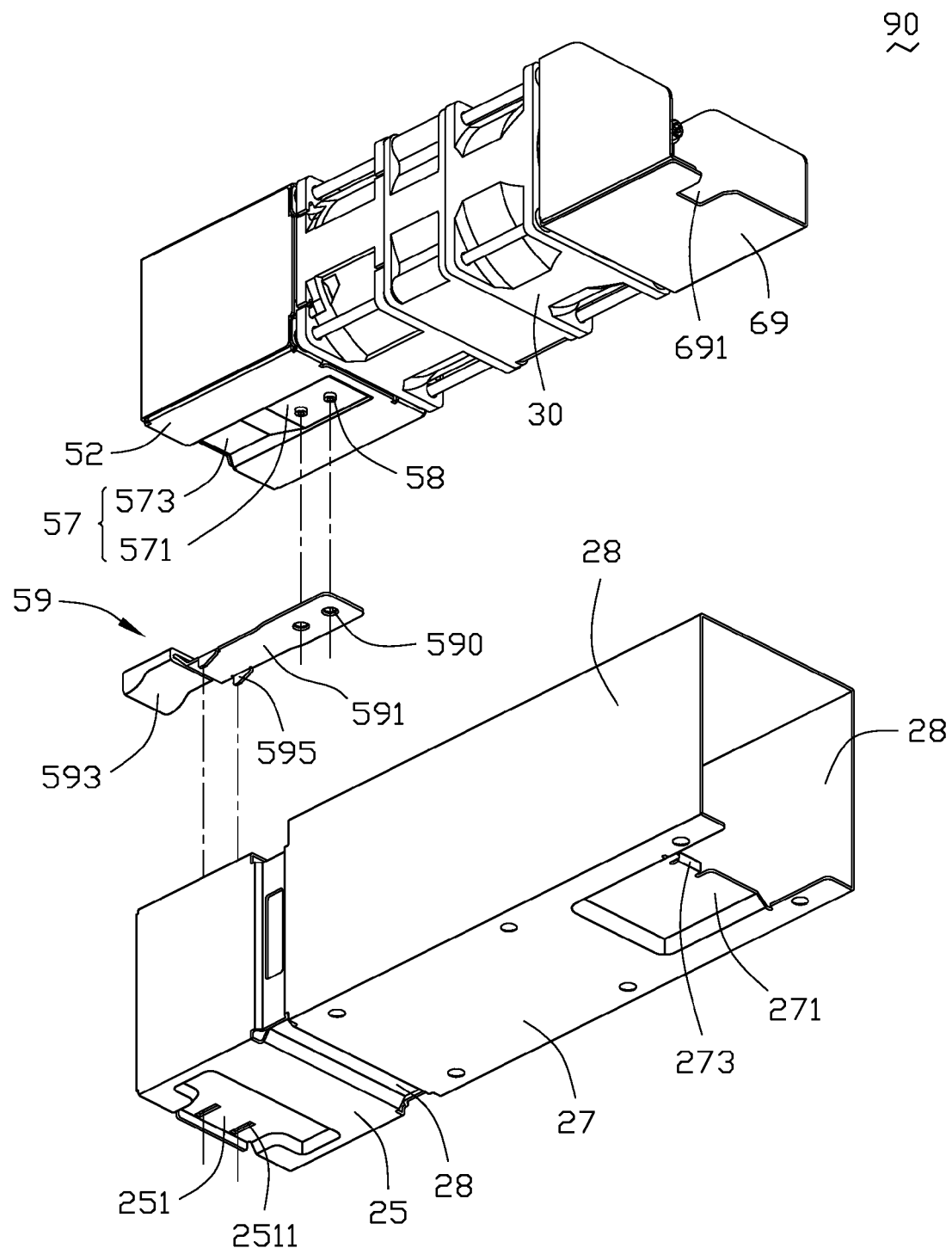
FIG. 4 is an exploded, isometric view of the heat dissipating device of FIG. 1, viewed from another aspect.

Referring to FIGS. 2 to 4, the fan module 90 includes a plurality of fans 30 individually connected, a first mounting bracket 50 connected to one side of the fans 30, and a second mounting bracket 60 connected to the other side of the fans 30. Each fan 30 defines a plurality of securing holes 31. The fans 30 are secured to the first mounting bracket 50 and the second mounting bracket with a plurality of fasteners 70. Each fastener 70 includes a head 71 and a securing shaft 73 extending from the head 71.

The first mounting bracket 50 includes a top wall 51, a bottom wall 52, and two sidewalls 53 connected between the top wall 51 and the bottom wall 52. The top wall 51, the bottom wall 52, and the sidewalls 53 cooperatively define a first opening 55 opposite to one of the fans 30. Four securing tabs 56 are located at four corners of the first opening 55. Each securing tab 56 defines a securing hole 561 corresponding to a securing hole 31 in one of the fans 30 and configured for the fastener 70 to extend therethrough. A guiding slot 563 communicates with the securing hole 561 and the first opening 55.

Referring to FIG. 4, the bottom wall 52 defines a recess 57 configured for seating an elastic positioning member 59. The recess 57 includes a securing portion 571 close to the bottom wall 52 and a receiving portion 573 away from the bottom wall 52. Two securing posts 58 protrude down from the securing portion 571. The elastic positioning member 59 includes a securing plate 591 and an operating handle 593 extending from one end thereof. Two securing holes 590 are defined in the securing plate 591, configured to receive the securing posts 58. Two securing hooks 595 extend down from two edges of the securing plate 591, and are located adjacent to the operating handle 593. The receiving portion 573 is configured for providing a moving space for the elastic positioning member 59. When the elastic positioning member 59 is secured to the securing portion 571 of the recess 57, the securing plate 591 of the elastic positioning member 59 aligns with the bottom wall 52.

The second mounting bracket 60 includes a bottom wall 69 and a rear section 61 perpendicular to the bottom wall 69. The rear section 61 defines a second opening 63 corresponding to the fans 30. Four securing holes 67 corresponding to the fan securing holes 31 are defined in four corners of the rear section 61, and configured for the fastener 70 to extend therethrough. Each securing slot 67 has a guiding path 671 communicating with the second opening 63. A cutout 691 is defined in the bottom wall 69.

The fan module 90 further includes a plurality of vibration absorbers 80 disposed between the fans 30 and the mounting brackets 50 and 60. Referring to FIG. 3, each vibration absorber 80 includes a first isolating wall 81 and a second isolating wall 83. A neck portion 85 connects the first isolating wall 81 and the second isolating wall 83. A mounting hole 87 is defined through the first isolating wall 81, the second isolating wall 83, and the neck portion 85.

In assembly of the fan module 90, the fans 30, the first mounting bracket 50, and the second mounting bracket 60 are aligned along a longitudinal axis. The neck portions 85 of the vibration absorbers 80 are received in the securing holes 561 and 67 of the first mounting bracket 50 and the second mounting bracket 60 via the guiding slots 563 and the guiding paths 671. The fasteners extend through the mounting holes 87 of the vibration absorbers 80 and the securing holes 31 in the fans 30 to secure the first mounting bracket 50 and the second mounting bracket 60 to the fans 30. When the vibration absorbers 80 are mounted to the first mounting bracket 50, the first isolating walls 81 of the vibration absorbers 80 are sandwiched between the securing tabs 56 and the heads 71 of the fasteners 70, and the second isolating walls 83 of the vibration absorbers 80 are sandwiched between one of the fans 30 and the securing tabs 56. When the vibration absorbers 80 are mounted to the second mounting bracket 60, the first isolating walls 81 of the vibration absorbers 80 are sandwiched between the rear section 61 and the heads 71 of the fasteners 70, and the second isolating walls 83 of the vibration absorbers 80 are sandwiched between the other fan 30 and the securing tabs 56 (as shown in FIG. 6).

Referring to FIGS. 1 and 4, the receiving bracket 20 includes a first top wall 23, a second top wall 21 lower than the first top wall 23, a first bottom wall 27 opposite to the first top wall 23, and a second bottom wall 25 opposite to the second top wall 21. The first bottom wall 27 and the second bottom wall 25 are aligned on a common plane. First bottom wall 27 is longer than the combined length of the fans 30, and a distance between the first top wall 23 and the first bottom wall 27 is greater than a height of the fans 30. A distance between the two sidewalls 28 is greater than a width of the fans 30. A connecting plate 253 connects the second bottom wall 25 to the first bottom wall 27. A first supporting wall 271 protrudes upward from the first bottom wall 27. A blocking hook 273 is bent from a side edge of the first supporting wall 271. A second supporting wall 251 protrudes upward from the second bottom wall 25. A distance between the second top wall 21 and the second supporting wall 251 is substantially equal to a height of the first mounting bracket 50 so that the first mounting bracket 50 tightly abuts the second top wall 21 and the second supporting wall 251. Two securing slots 2511 are defined in the second supporting wall 251 configured for receiving the securing hooks 595 therein.

Figure 5:
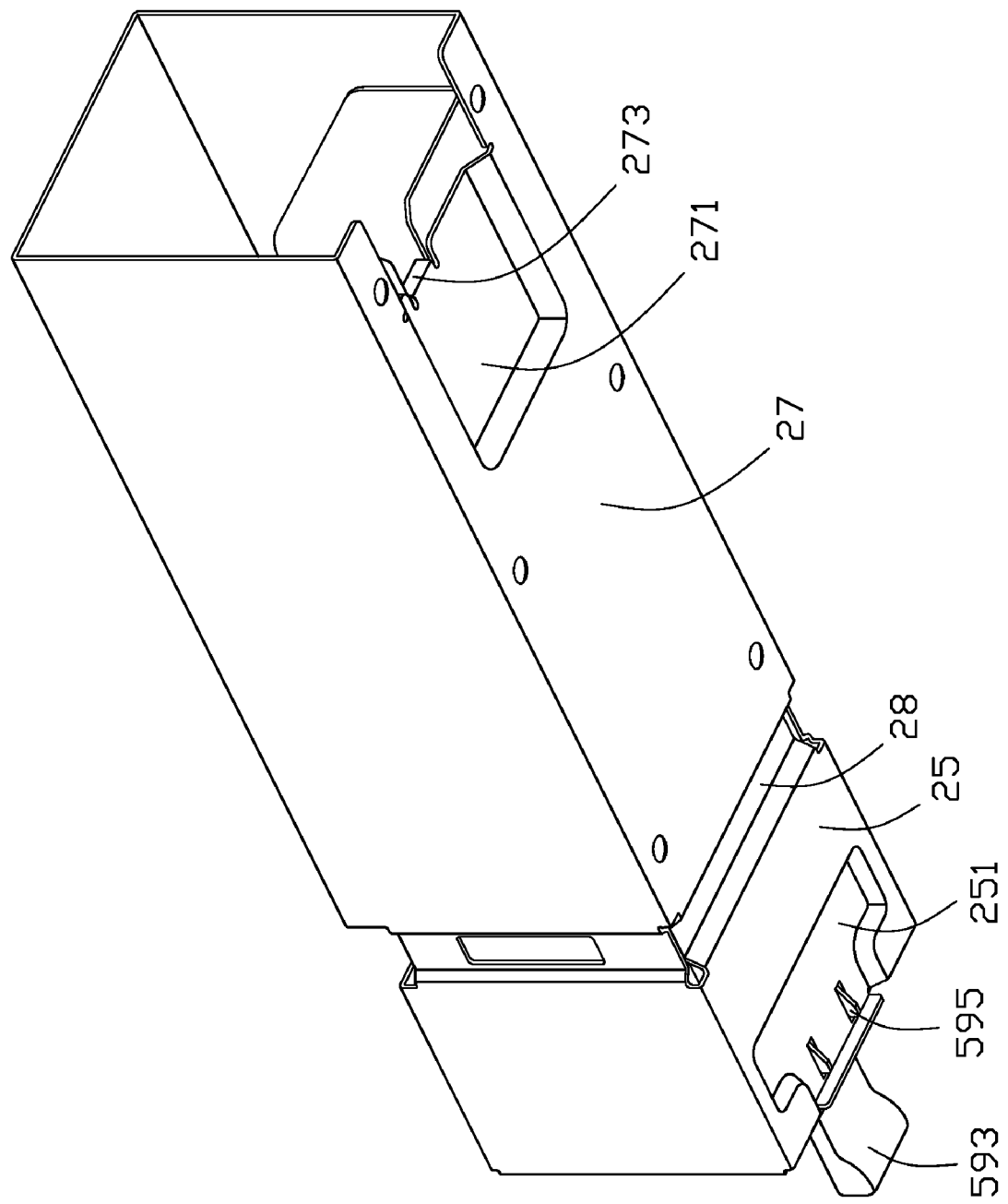
FIG. 5 is an assembled view of FIG. 4.
Figure 6:
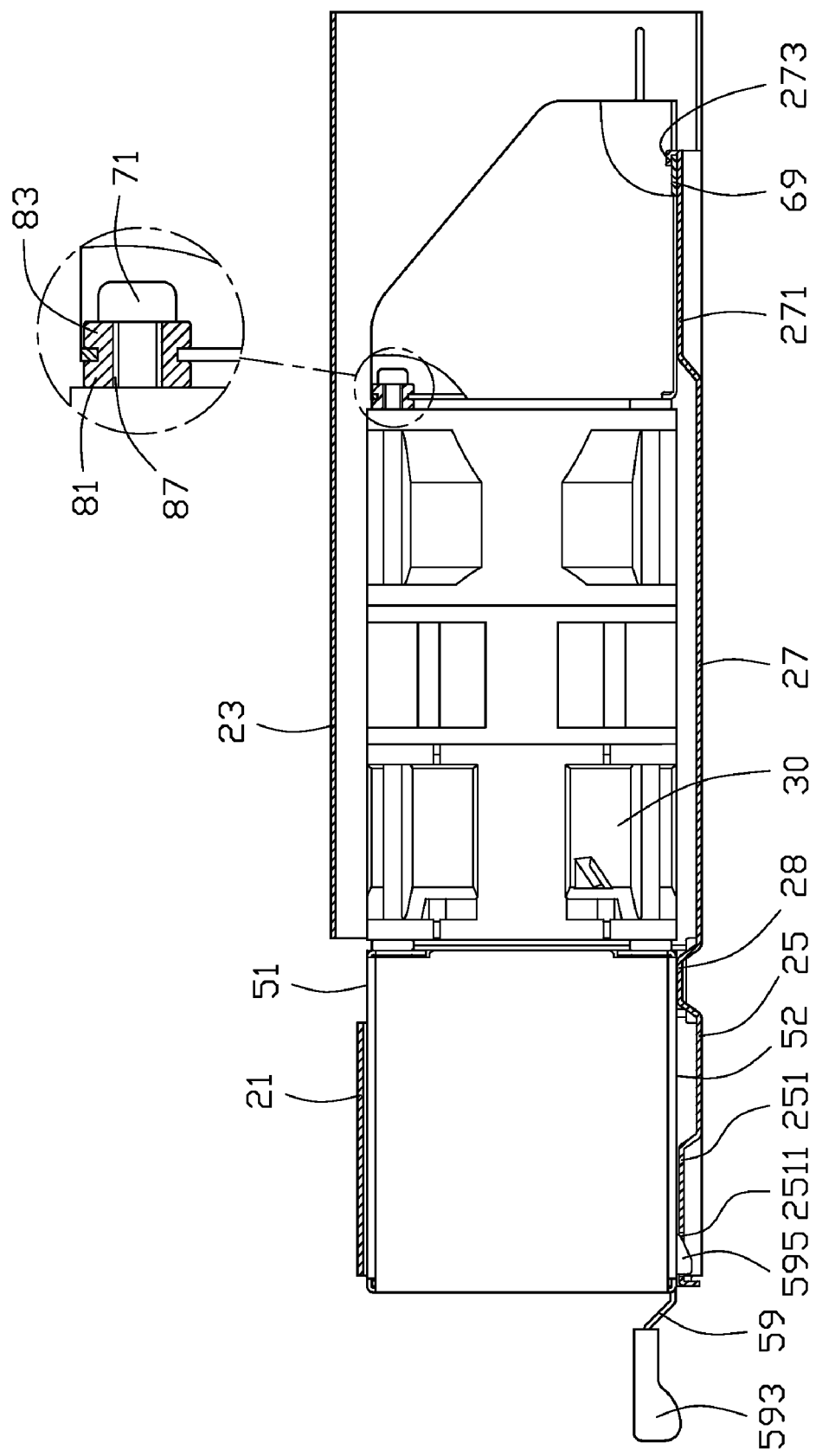
FIG. 6 is a side cutaway view of FIG. 5.

Referring to FIGS. 5 and 6, in assembly of the fan module 90 in the receiving bracket 20, the fan module 90 slides into the receiving bracket 20 from a receiving bracket opening adjacent to the second top wall 21 and the second supporting wall 251. The second mounting bracket 60 of the fan module 90 enters into the receiving bracket 20 first. The elastic positioning member 59 is resiliently deflected toward the receiving portion 573 of the first mounting bracket recess 57 by the second supporting wall 251 during insertion of the fan module 90 into the receiving bracket 20. When the fan module 90 is fully accommodated in the bracket 20 as shown in FIG. 5, the blocking hook 273 of the first supporting wall 271 engages with an edge of the cutout 691 in the second mounting bracket 60 to prevent the fan module 90 further moving. The securing hooks 595 of the elastic positioning member 59 engage in the slots 2511 in the second supporting wall 251 to prevent the fan module 90 moving backward. Thus, the first mounting bracket 50 is tightly sandwiched between the second top wall 21, and the second supporting wall 251 and the connecting plate 28. The second mounting bracket 60 sits on the first supporting wall 271. The fans 30 are located above the first bottom wall 27 and are isolated from the first bottom wall 27, the first top wall 23, and the two sidewalls 28 to prevent vibration transferring from the receiving bracket 20 to the fans 30.

When the receiving bracket 20 is assembled in the electronic device enclosure 10, vibration is efficiently prevented from transferring to the fans 30 as the fans 30 are isolated from the receiving bracket 20 by the vibration absorbers 80 disposed between the mounting brackets 50, 60 and the fans 30. Further, vibration generated from the first mounting brackets 50, the second mounting bracket 60, and the fasteners 70 will be absorbed by the vibration absorbers 80 to prevent transfer thereof to the fans 30.

It is to be understood, however, that even though numerous characteristics and advantages of the embodiments have been set forth in the foregoing description, together with details of the structure and function of the present disclosure, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. A heat dissipating device, comprising:
 a receiving bracket comprising a supporting wall, and the supporting wall defines two securing slots;
 a fan;
 a mounting bracket connected to the fan;
 at least one vibration absorber having a first isolating wall and a second isolating wall, the first isolating wall disposed between the fan and the mounting bracket, and the second isolating wall disposed between the mounting bracket and the fastener; and
 a positioning member secured on the mounting bracket, two hooks protrude from the positioning member, and the two hooks are engaged in the securing slots.

2. The heat dissipating device of claim 1, wherein the fan is connected to the mounting bracket via at least one fastener, the at least one fastener comprising a securing head, the second isolating wall is disposed between the mounting bracket and the securing head of the fastener.

3. The heat dissipating device of claim 2, wherein the mounting bracket defines a securing hole, the fastener extends therethrough, and the vibration absorber comprises a neck portion connected between the first isolating wall and the second isolating wall, the neck portion is received in the securing hole.

4. The heat dissipating device of claim 3, wherein the vibration absorber defines a mounting hole through the two isolating walls and the neck portion, the fastener extend therethrough to connect the fan and the mounting bracket.

5. The heat dissipating device of claim 3, wherein the mounting bracket defines a guiding slot communicating with the securing hole, the guiding slot configured for the neck portion of the vibration absorber entering into the securing hole.

6. The heat dissipating device of claim 1, wherein the receiving bracket comprises a first top wall and a bottom wall, a distance therebetween exceeding a height of the fan.

7. The heat dissipating device of claim 6, wherein the receiving bracket further comprises two opposite sidewalls, a distance between which exceeds a width of the fan.

8. The heat dissipating device of claim 1, wherein the mounting bracket defines a notch, the positioning member is received on the notch, the notch is configured to provide a moving space for the positioning member to allow the hooks to disengage from the securing slots.

9. The heat dissipating device of claim 1, wherein the receiving bracket comprises a second top wall lower than the first top wall, the distance between the first top wall and the second top wall is substantially equal to a height of the mounting bracket, and the mounting bracket is disposed between the supporting wall and the second wall.

10. The heat dissipating device of claim 9, wherein the heat dissipating device further comprises a vibration absorber having a first isolating wall disposed between the fan and the mounting bracket.

11. The heat dissipating device of claim 10, wherein the mounting bracket is connected to the fan by a fastener having a head, and the vibration absorber comprises a second isolating wall disposed between the mounting bracket and the head of the fastener.

12. The heat dissipating device of claim 11, wherein the mounting bracket defines a securing hole, the fastener extends therethrough, and the vibration absorber comprises a neck portion connected between the two isolating walls, the neck portion is received in the securing hole.

13. The heat dissipating device of claim 11, wherein the vibration absorber defines a mounting hole through the two isolating walls and the neck portion, the fastener extends therethrough to connect the fan and the mounting bracket.

14. The heat dissipating device of claim 11, wherein the mounting bracket defines a guiding slot communicating with the securing hole, configured for the neck portion of the elastic vibration absorber to enter into the securing hole therefrom.

15. A heat dissipating device, comprising:
 an electronic device enclosure;
 a receiving bracket secured to the electronic device enclosure, the receiving bracket comprising a first top wall, a bottom wall, a supporting wall protruding upward from the bottom wall, and two opposite sidewalls perpendicular to the first top wall and the bottom wall;

a fan module secured to the receiving bracket, the fan module comprising at least one fan and at least one mounting bracket connected to the at least one fan; wherein the at least one mounting bracket is secured to the supporting wall to define a gap between the bottom wall and the at least one fan, so that the at least fan is suspended between the first top wall and the bottom wall and is isolated from the two sidewalls of the receiving bracket.

16. The heat dissipating device of claim 15, wherein a positioning member is secured on the mounting bracket, two hooks protrude from the positioning member, the supporting wall defines two securing slots, and the hooks engage the securing slots.

17. The heat dissipating device of claim 16, wherein the mounting bracket defines a notch, the positioning member is received in the notch, the notch is configured to provide a moving space for the positioning member to allow the hooks to disengage from the securing slots.

18. The heat dissipating device of claim 16, wherein the receiving bracket comprises a second top wall lower than the first top wall, the distance between the supporting wall and the second top wall is substantially equal to a height of the mounting bracket, the mounting bracket is disposed between the supporting wall and the second wall.

* * * * *

UNITED STATES PATENT AND TRADEMARK OFFICE
CERTIFICATE OF CORRECTION

PATENT NO. : 8,282,345 B2  
APPLICATION NO. : 12/482890  
DATED : October 9, 2012  
INVENTOR(S) : Chen-Lu Fan et al.

Page 1 of 1

It is certified that error appears in the above-identified patent and that said Letters Patent is hereby corrected as shown below:

Title page, below Item (65) insert:

-- (30)   Foreign Application Priority Data

Jan. 7, 2009   (CN) ...........................200920300085.X --

Signed and Sealed this
Eighth Day of April, 2014

Michelle K. Lee
*Deputy Director of the United States Patent and Trademark Office*